(12) United States Patent
Fitzgerald et al.

(10) Patent No.: US 7,202,124 B2
(45) Date of Patent: Apr. 10, 2007

(54) STRAINED GETTERING LAYERS FOR SEMICONDUCTOR PROCESSES

(75) Inventors: Eugene A. Fitzgerald, Windham, NH (US); Arthur J. Pitera, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/956,481

(22) Filed: Oct. 1, 2004

(65) Prior Publication Data

US 2006/0073674 A1    Apr. 6, 2006

(51) Int. Cl.
*H01L 21/8238*    (2006.01)
*H01L 21/322*    (2006.01)

(52) U.S. Cl. .............. 438/200; 438/474; 438/471; 257/E29.003; 257/21.571

(58) Field of Classification Search .......... 438/200, 438/526, 455, 471, 473, 474, 479, 458; 257/E29.003, 257/E29.004, E21.09, E21.123, E21.571
See application file for complete search history.

(56) References Cited

U.S. PATENT DOCUMENTS

| | | | |
|---|---|---|---|
| 4,845,044 A * | 7/1989 | Ariyoshi et al. ............ 438/480 |
| 5,374,564 A | 12/1994 | Bruel |
| 5,714,395 A * | 2/1998 | Bruel ........................ 438/528 |
| 5,882,987 A | 3/1999 | Srikrishnan |
| 5,993,493 A * | 11/1999 | Takamizawa et al. ....... 29/25.01 |
| 6,083,324 A * | 7/2000 | Henley et al. ............. 148/33.2 |
| 6,184,111 B1 | 2/2001 | Henley et al. |
| 6,323,108 B1 * | 11/2001 | Kub et al. .................. 438/458 |
| 6,335,264 B1 | 1/2002 | Henley et al. |
| 6,352,909 B1 * | 3/2002 | Usenko ...................... 438/458 |
| 6,391,740 B1 | 5/2002 | Cheung et al. |
| 6,458,723 B1 | 10/2002 | Henley et al. |
| 6,500,732 B1 * | 12/2002 | Henley et al. ............. 438/459 |
| 6,548,382 B1 * | 4/2003 | Henley et al. ............. 438/526 |
| 6,632,724 B2 | 10/2003 | Henley et al. |
| 6,696,352 B1 * | 2/2004 | Carr et al. .................. 438/458 |
| 6,727,136 B1 * | 4/2004 | Buller et al. ................ 438/231 |
| 6,774,015 B1 * | 8/2004 | Cohen et al. ............... 438/479 |

(Continued)

OTHER PUBLICATIONS

Agarwal et al., Efficient production of silicon-on-insulator films by co-implantation of $He^+$ with $H^+$, App. Phys. Lett. 72, 1086-1088 (1998).

(Continued)

*Primary Examiner*—Walter L. Lindsay, Jr.
(74) *Attorney, Agent, or Firm*—Wolf, Greenfield & Sacks, P.C.

(57) ABSTRACT

A method and structure for forming semiconductor structures using tensilely strained gettering layers. The method includes forming a donor wafer comprising a tensilely strained gettering layer disposed over a substrate, and at least one material layer disposed over the tensilely strained gettering layer. Additionally, the donor wafer may possess a particle-confining region proximate the tensilely strained layer. The method also includes introducing particles into the donor wafer to a depth below the surface, and accumulating at least some particles within the tensilely strained gettering layer. Next, the method includes initiating a cleaving action so as to separate at least one of the material layers form the substrate. The tensilely strained gettering layer may accumulate particles and/or point defects and reduce the implantation dose and thermal budget required for cleaving.

55 Claims, 16 Drawing Sheets

U.S. PATENT DOCUMENTS

| | | | |
|---|---|---|---|
| 6,787,407 B2* | 9/2004 | Nakamura et al. | 438/166 |
| 6,890,838 B2* | 5/2005 | Henley et al. | 438/475 |
| 7,008,854 B2* | 3/2006 | Forbes | 438/403 |
| 7,067,396 B2* | 6/2006 | Aspar et al. | 438/459 |
| 7,105,895 B2* | 9/2006 | Wang et al. | 257/347 |
| 2002/0072130 A1* | 6/2002 | Cheng et al. | 438/10 |
| 2002/0105015 A1 | 8/2002 | Kubo et al. | |
| 2003/0017626 A1* | 1/2003 | Hilt et al. | 438/3 |
| 2003/0143794 A1* | 7/2003 | Nakamura et al. | 438/200 |
| 2003/0148565 A1* | 8/2003 | Yamanaka | 438/200 |
| 2003/0218189 A1 | 11/2003 | Christiansen et al. | |
| 2004/0178406 A1 | 9/2004 | Chu | |
| 2006/0001088 A1 | 1/2006 | Chan et al. | |
| 2006/0220127 A1* | 10/2006 | Mantl | 257/347 |

OTHER PUBLICATIONS

Bruel, Silicon on insulator material technology, Electron Lett. 31, 1201-1202 (1995).

Corni et al., Helium-implanted silicon: A study of bubble precursors, J. Appl. Phys. 85, 1401-1408 (1999).

Corni et al., Solid State Phenomena 69-70, 229-234 (1999).

Johnson, Mechanism for hydrogen compensation of shallow-acceptor impurities in single-crystal silicon, Phys. Rev. B 31, 5525-5528 (1985).

Myers et al., Interaction of coppoer with cavities in silicon, J. Appl. Phys. 79, 1337-1350 (1996).

Langdo et al., SiGe free strained Si on insulator by wafer bonding and layer transfer, Appl. Phys. Lett. 82, No. 24, 4256-4258 (2003).

Pitera et al., Coplanar integration of Lattice-Mismatched Semiconductors with Silicon by Wafer Bonding Ge/$Si_{1-x}Ge_x$/Si Virtual Substrates, J. Electrochem. Soc. 151, G443-G447 (2004).

Rainerl et al., Gettering of metals by voids in silicon, J. Appl. Phys. 78, 3727-3735 (1995).

Tong et al., A "smarter-cut" approach to low temperature silicon layer transfer, Appl. Phys. Lett. 72, 49-51 (1998).

Ulyashin et al., The hydrogen gettering at post-implantation hydrogen plasma treatments of helium- and hydrogen implanted Czochralski silicon, Materials Science and Engineering B73 B73, 64-68 (2000).

Usenko et al., Transformation of hydrogen trapped onto microbubbles into H platelet layer in SI, Journal of Materials Science: Materials in Electronics 14, 305-309 (2003).

Notification of Transmittal of the International Search Report and the Written Opinion of the ISR for International Application No. PCT/US2005/035595, date mailed Feb. 15, 2006.

* cited by examiner

STRAINED GETTERING LAYERS FOR SEMICONDUCTOR PROCESSES

BACKGROUND OF INVENTION

1. Field of Invention

This invention relates generally to the manufacture of semiconductor structures. More particularly, the invention entails the use of strained gettering layers for fabrication of semiconductor structures.

2. Discussion of Related Art

Entrapment of a mobile species, referred to as "gettering," is ubiquitous to semiconductor processing. A familiar application for gettering is contamination control, wherein contamination is drawn away from critical device regions by confining fast diffusing impurity species to isolated gettering regions in the semiconductor wafer. For this reason, gettering methods are typically engineered into semiconductor substrates during wafer manufacturing. Some of these techniques include $SiO_2$ precipitation, intentional mechanical damage and introduction of internal voids by $He^+$ implantation.

Another application of gettering, albeit inadvertent, occurs during the layer exfoliation technology of SOITEC Corporation of France and marketed as the Smartcut™ process, wherein a thin layer of material is separated from a donor wafer by means of hydrogen and/or helium ion implantation. The combination of wafer bonding and layer exfoliation, also known as layer transfer, is the basis for fabrication of many advanced substrate structures including silicon-on-insulator (SOI), strained-silicon-on-insulator (SSOI) and germanium-on-insulator (GOI). Due to its versatility, layer transfer can be used to transfer virtually any material from a donor wafer onto a second wafer (called the handle wafer) of arbitrary composition for material integration applications.

Layer exfoliation occurs due to the joint action of implanted hydrogen and defects created within the donor wafer by the implantation procedure. These material imperfections, including point defects (e.g., vacancies, interstitials) and extended defects (e.g., platelets, vacancy clusters, voids) behave as gettering centers for hydrogen, thus preventing its effusion during subsequent annealing treatments. Platelets and voids are known to be particularly efficient gettering centers for hydrogen. During annealing, the hydrogen pressurizes such defects, leading to mechanical cleaving below the surface of the wafer and exfoliation of the surface layer. Furthermore, defects also behave as mutual gettering centers. One such example of mutual defect gettering is the coalescence of vacancies to form vacancy clusters, voids and other extended defects, which in turn contribute to the overall exfoliation process. Cavities are particularly strong gettering sites for vacancies, causing the volume of the cavity to expand during post implantation annealing.

Conventional layer exfoliation methods possess a number of limitations. A major drawback of conventional methods is the requirement for a relatively high implantation dose ($\sim 1 \times 10^{17}$ $cm^{-2}$) to induce layer transfer. Although modern ion implantation tools have the capability of delivering such high doses, implantation steps are nonetheless expensive. Another limitation is that processing temperatures must be minimized during bonding of thermally mismatched wafer pairs to avoid bond failure during the annealing stage of layer transfer. Another drawback is that small variations in implantation conditions may have a large effect on the density and type of defects formed during implantation which, in turn, might alter the annealing schedule required for layer transfer. Such variations may lead to process instabilities which must be avoided for commercial application of layer exfoliation.

A number of methods that utilize hydrogen gettering have been proposed in efforts to improve the layer exfoliation process. One technique involves co-implantation of boron with hydrogen in a process, wherein electronically active acceptor states getter hydrogen through formation of H complexes. This gettering effect may prevent effusion of the implanted hydrogen and provide a nucleation site for platelet formation. Co-implantation of boron also increases the amount of damage in the wafer, potentially increasing its hydrogen gettering efficiency, and reducing the thermal budget for layer transfer. Despite this benefit, this approach requires a large implantation dose to induce layer exfoliation, resulting in broad damage profiles and increased processing costs.

Another modification to the Smartcut™ process involves the reduction of the implantation dose for layer exfoliation via the co-implantation of $H^+$ and $He^+$ ions. The process exploits the efficiency of H in producing extended defects with the efficiency of He for pressurizing these defects, ultimately leading to material cleavage. The presence of both hydrogen and helium species has a synergistic effect and allows Si layer transfer with a combined $H^+/He^+$ implantation dose of less than $2 \times 10^{16}$ $cm^{-2}$. Although the $H^+/He^+$ co-implantation method reduces the overall dose needed for exfoliation, it relies on an implantation procedure to produce the defects that ultimately cause layer transfer. Ion implantation produces a diffuse damage profile, resulting in a broad gettering region for the species participating in layer exfoliation and, therefore, a diffuse cleavage plane with large surface roughness. Furthermore, even more efficient layer transfer would be possible if the species participating in layer exfoliation were confined to a narrower region.

Yet another modification involves the formation of a damaged region below the surface of the donor wafer by means of an inert gas or self ion implantation. This process offers a low cost solution for SOI since the required dose of the implant is only $\sim 10^{15}$ $cm^{-2}$. However, a final high temperature anneal is required to anneal out the lattice damage caused by the heavy ion implantation step.

Still another variation makes use of a cleave layer, wherein a donor substrate incorporates a compressively strained SiGe cleave layer along which cleaving action is claimed to occur. Implanted H segregates to the periphery of the cleave layer, resulting in a lower H concentration in the cleave layer. This behavior is expected and corresponds with other experimental observations where interstitial hydrogen is repelled from regions of compressive strain. The combination of these effects results in a situation where the location of the various components that participate in layer exfoliation (e.g., H, and the cleave layer) do not coincide.

A need therefore exists for an improved process incorporating a strained gettering layer that is effective for H and/or He, allowing for accumulation of H and/or He within the gettering layer. In addition, a need also exists for an improved process incorporating a strained gettering layer that is effective in accumulating point defects (e.g., interstitials, vacancies) introduced during the implantation process. In this way, components that are vital to layer exfoliation segregate within a confined strained layer, creating a selectively damaged layer along which layer exfoliation occurs.

SUMMARY

According to some embodiments, a method for separating at least one material layer from a substrate comprising providing a substrate, disposing a tensilely strained monocrystalline layer over the substrate, wherein the tensilely strained monocrystalline layer provides gettering sites for particles, disposing at least one material layer over the tensilely strained monocrystalline layer, thereby forming a donor wafer comprising the at least one material layer, the tensilely strained monocrystalline layer and the substrate, introducing particles through the surface of the donor wafer, to a depth proximate the tensilely strained monocrystalline layer, gettering at least some of the particles within the tensilely strained monocrystalline layer, and initiating and completing a cleaving action proximate the tensilely strained monocrystalline layer, so as to separate at least a portion of the at least one material layer from the substrate.

In further embodiments, a method for forming extended defects within a tensilely strained monocrystalline layer comprising providing a substrate, disposing a tensilely strained monocrystalline layer over the substrate, wherein the tensilely strained monocrystalline layer provides gettering sites for particles, gettering at least some particles within the tensilely strained monocrystalline layer, and forming extended defects within the tensilely strained monocrystalline layer.

In one embodiment, a semiconductor structure comprising a substrate, a tensilely strained monocrystalline layer disposed over the substrate, an additional strained monocrystalline layer disposed over the tensilely strained monocrystalline layer, and an particle confining region disposed proximate the tensilely strained monocrystalline layer.

In some embodiments, a method for separating at least one material layer from a substrate comprising providing a substrate, disposing a tensilely strained monocrystalline layer over the substrate, wherein the tensilely strained monocrystalline layer provides gettering sites for point defects, disposing at least one material layer over the tensilely strained monocrystalline layer, thereby forming a donor wafer comprising the at least one material layer, the tensilely strained monocrystalline layer and the substrate, introducing particles through the surface of the donor wafer, to a depth proximate the tensilely strained monocrystalline layer, gettering at least some of the point defects within the tensilely strained monocrystalline layer, and initiating and completing a cleaving action proximate the tensilely strained monocrystalline layer, so as to separate at least a portion of the at least one material layer from the substrate.

In further embodiments, a method for forming extended defects within a tensilely strained monocrystalline layer comprising providing a substrate, disposing a tensilely strained monocrystalline layer over the substrate, wherein the tensilely strained monocrystalline layer provides gettering sites for point defects, gettering at least some point defects within the tensilely strained monocrystalline layer, and forming extended defects within the tensilely strained monocrystalline layer.

BRIEF DESCRIPTION OF DRAWINGS

The accompanying drawings, are not intended to be drawn to scale. In the drawings, each identical or nearly identical component that is illustrated in various figures is represented by a like identifier. For purposes of clarity, not every component may be labeled in every drawing. In the drawings.

DETAILED DESCRIPTION

Figure 1A:
FIG. 1A is a schematic illustration of an initial wafer.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Embodiments presented provide methods and structures wherein a tensilely strained gettering layer accumulates particles and point defects. In some embodiments, a tensilely strained gettering layer within a donor wafer accumulates particles and point defects and reduces the implantation dose and thermal budget required for layer transfer by gettering the species involved in a layer exfoliation process.

In the embodiment illustrated in FIG. 1A–1F, a method for transferring layers from a donor wafer 101 via layer exfoliation is provided. FIG. 1A illustrates an initial wafer 104, wherein examples of initial wafers 104 may include bulk silicon (Si), germanium (Ge), gallium arsenide (GaAs), indium phosphide (InP), and gallium phosphide (GaP) wafers. The initial wafer 104 may also comprise engineered wafers, for example any type of semiconductor-on-insulator wafer (e.g., silicon-on-insulator, strained silicon-on-insulator, germanium-on-insulator, strained germanium-on-insulator, SiGe-on-insulator, and GaAs-on-insulator), or any type of semiconductor-on-semiconductor wafer (e.g., germanium-on-silicon, and GaAs-on-silicon).

Figure 1B:
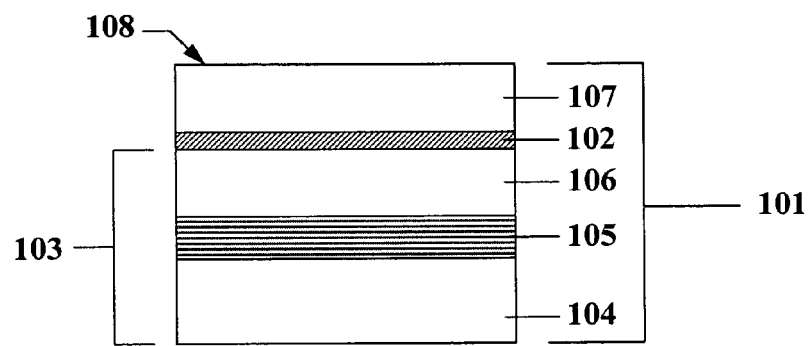
FIG. 1B is a schematic illustration of a donor wafer comprising a tensilely strained gettering layer disposed over the initial wafer of FIG. 1A.

As illustrated in FIG. 1B, a substrate 103 may comprises the initial wafer 104 over which layers 105 and 106 may be optionally disposed. In some embodiments, the substrate 103 may comprise a relaxed graded buffer 105 graded to an arbitrary lattice constant to allow for the formation of a relaxed layer 106. The graded buffer 105 may comprise a multi-layer structure of relaxed, partially strained or fully strained layers with increasing relaxed lattice constant. Graded buffers and their fabrication are well known to those skilled in the art. In some embodiments, the substrate 103 may comprise a compositionally graded buffer 105 of monocrystalline $Si_{1-y}Ge_y$, $In_yGa_{1-y}As$, $In_yGa_{1-y}P$ and/or other combinations of at least one group III and one group V element. In some embodiments, the substrate 103 may comprise the initial wafer 104, including bulk wafers of Si, Ge, GaAs, InP, GaP and other compound semiconductors without any graded buffer 105. In numerous embodiments, the substrate 103 may possess a lattice constant greater than the lattice constant of relaxed silicon, as in the case of bulk Ge, GaAs, or InP substrates, or relaxed $Si_{1-y}Ge_y$, $In_yGa_{1-y}As$, or $In_yGa_{1-y}P$ graded buffers.

The compositionally graded buffer 105 may be fabricated by a variety of film deposition techniques, depending on the materials being grown. $Si_{1-y}Ge_y$ layers with gradually increasing y, for example 10%/µm, can be deposited using ultra-high vacuum chemical vapor deposition (UHVCVD), low pressure CVD (LPCVD), reduced pressure CVD (RPCVD) or atmospheric pressure CVD (APCVD), for example. III-V and other compound semiconductors can be grown using organometallic chemical vapor deposition (OMCVD), for example. The surface of the compositionally graded buffer is substantially relaxed, and may have any lattice constant within the composition range of the material system being grown, allowing for the formation of a relaxed layer 106. Furthermore, the compositionally graded buffer 105 and relaxed layer 106 can be planarized by methods such as chemical mechanical planarization (CMP) prior to subsequent layer deposition, to ensure a sufficiently smooth surface morphology.

A donor wafer 101 is then formed by disposing a tensilely strained gettering layer 102 and optional additional layers over the substrate 103, wherein the tensilely strained gettering layer possesses gettering sites for particles and/or point defects. For example, in numerous embodiments, the gettering sites for particles and/or point defects may be due in part to tensile strain in the gettering layer. In one embodiment, the donor wafer 101 may comprise a tensilely strained gettering layer 102 disposed over the substrate 103, and a material layer 107 disposed over the tensilely strained gettering layer 102.

In one embodiment, a tensilely strained gettering layer 102 is disposed over the donor substrate 103 by growing an epitaxial layer with a relaxed lattice constant smaller than that of the substrate. For example, in the case of a SiGe system comprising a tensiley strained $Si_{1-x}Ge_x$ gettering layer on a relaxed $Si_{1-y}Ge_y$ substrate surface, x is less than y. In one embodiment, the gettering layer comprises a $Si_{1-x}Ge_x$ (x<1) layer disposed over a relaxed Ge substrate. This particular embodiment is relevant to the transfer of relaxed Ge layers via layer exfoliation.

The gettering layer may be grown utilizing any deposition technique mentioned for graded buffer growth in addition to molecular beam epitaxy (MBE) and variations thereof. The growth temperature of the gettering layer is preferably chosen so as to minimize relaxation of metastable layers grown beyond the critical thickness and maintain planar morphology. Growth temperature is also a function of gettering layer strain, composition, desired thickness and growth technique. For example, utilizing UHVCVD with silane ($SiH_4$) and germane ($GeH_4$) precursor gases, the growth temperature for tensilely strained $Si_{0.4}Ge_{0.6}$ layers can fall between about 400° C. and about 650° C. with a nominal value of about 450° C. In embodiments involving Ge, layers may be grown by any of the methods mentioned previously at a temperature suitable for Ge epitaxy.

In one embodiment, the composition of a tensilely strained $Si_{1-x}Ge_x$ gettering layer is chosen to provide sufficient tensile strain for gettering while maintaining suitable material quality. The Ge content of this layer typically varies between x=0.4 and x=0.95 with a nominal composition of x=0.6. The thickness of the gettering layer depends on several factors, including the magnitude of its strain, composition and growth temperature and can fall, for example, within the range of about 3–100 nm with a preferred thickness of abouzst 5–20 nm.

In some embodiments, layer 107, disposed over the tensilely strained gettering layer 102, may comprise a semiconductor layer. In addition, layer 107 may be relaxed, tensilely strained or compressively strained. In specific embodiments relevant to transfer of relaxed Ge layers via layer exfoliation, layer 107 may comprise a relaxed Ge layer.

Figure 1C:
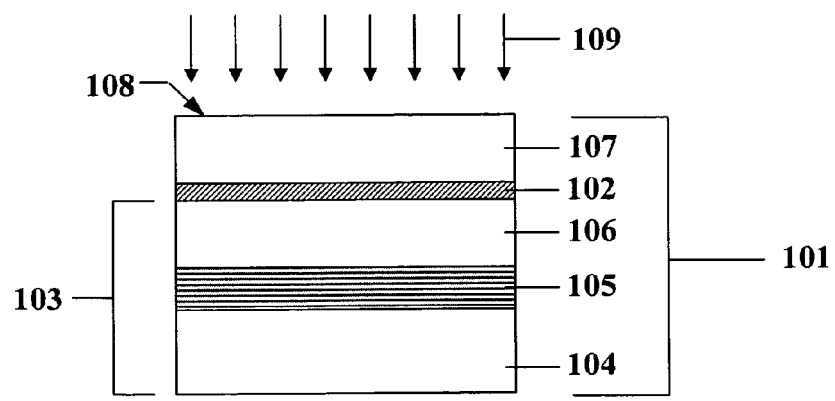
FIG. 1C is a schematic illustration of the implantation of particles into the surface of the donor wafer of FIG. 1B.

FIG. 1C illustrates the method including the implantation 109 of particles (e.g., H, He) of specified energy and dose through the surface 108 of the donor wafer 101, thereby creating a locally enhanced particle and/or point defect concentration in the vicinity of the gettering layer. Furthermore, the donor wafer may be supplied with additional energy to further enhance the localization and hence accumulation of particles and/or point defects (i.e., vacancies and/or interstitials) at the gettering layer. For example, the donor wafer 101 may be annealed in any number of ways, including, but not limited to, annealing the donor wafer 101 in an tube or furnace at elevated temperatures so as to impart energy to particles and/or point defects, thereby increasing their mobility within the donor wafer 101. Mobile particles and/or point defects may migrate to the gettering layer and be trapped in the gettering layer, thereby enhancing the localization of particles and/or point defects at the gettering layer. Additional techniques for supplying energy to the donor wager 101 are possible; for example, the particle implantation process 109 may supply energy to the donor wafer 101 via the transference of kinetic energy from the implanted particles to the donor wafer 101. It should be appreciated that any other technique for supplying energy to the donor wafer may be used and the embodiments are by no means limited to the aforementioned methods.

In some embodiments, the localization of the species participating in the layer exfoliation process (e.g., particles and/or point defects) may contribute to preferential nucleation of extended defects at the gettering layer, resulting in a selectively damaged region below the surface. In further embodiments, tensile strain in the gettering layer and the localization of the species participating in the layer exfoliation process may contribute to preferential nucleation of extended defects at the gettering layer, resulting in a selectively damaged region below the surface. Such extended defects may include platelets and/or voids which in themselves may also contribute to the overall gettering of layer 102 and may ultimately cause preferential crack nucleation and exfoliation.

In one embodiment, crack nucleation occurs in the proximate the tensilely strained gettering layer 102, thereby causing a cleaving action proximate the tensilely strained gettering layer 102, and therefore the formation of a cleave plane and hence separation (i.e., exfoliation) of at least a portion of layer 107 from the substrate 103. Crack nucleation may be initiated by any number of processes, including, for example, annealing the donor wafer 101, and more generally, application of energy to the donor wafer 101, either globally or locally.

Figure 1D:
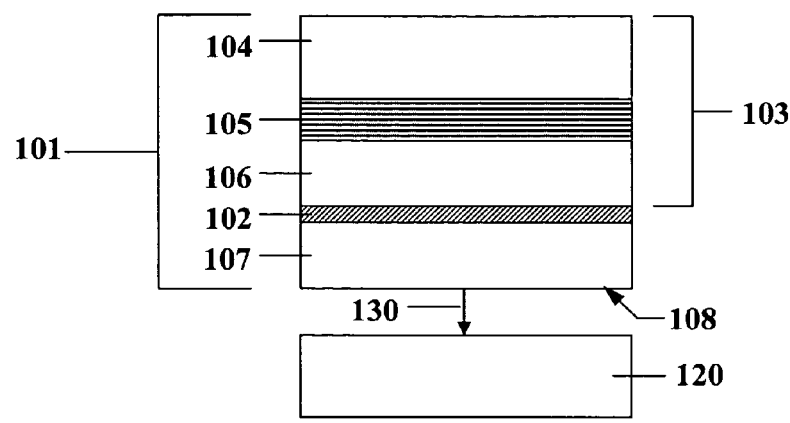
FIG. 1D is a schematic illustration of the bonding of the donor wafer of FIG. 1C to a handle wafer.

In further embodiments, prior to layer exfoliation, the donor wafer 101 implanted with particles (as was illustrated in FIG. 1C) is flipped over and wafer bonded (as indicated by arrow 130) to a handle wafer 120, as illustrated in FIG. 1D. Optionally, a planarization step (not shown) may be performed on the surface 108 of the donor wafer so as to smooth the surface 108 and facilitate bonding to the handle wafer. Handle wafer 120 may comprise any wafer with suitable mechanical, electrical, optical, and/or thermal properties for the intended use. For example, the handle wafer 120 may comprise a bulk silicon wafer, or a silicon wafer with an oxide layer disposed over the wafer surface. The example of a handle wafer 120 comprising an oxide layer disposed over a silicon wafer is relevant for forming structures of transferred layers over insulator.

Figure 1E:
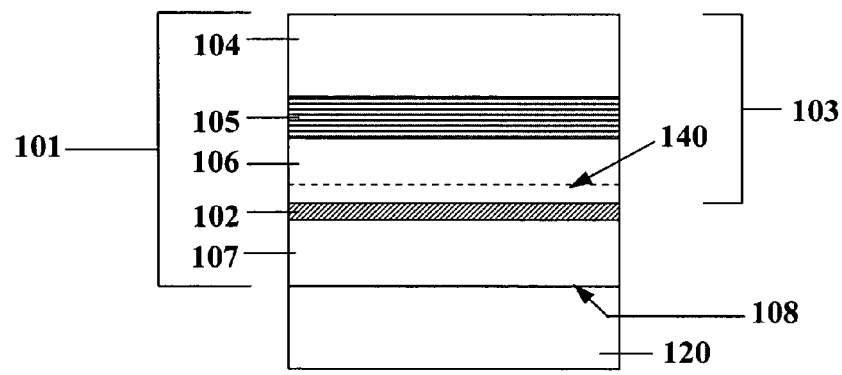
FIG. 1E is a schematic illustration of the wafer bonded pair formed in FIG. 1D with a cleave plane within the donor wafer.

FIG. 1E illustrates a structure wherein the donor wafer 101 is bonded to the handle wafer 120, thereby forming a bonded wafer pair. After bonding, a cleave plane 140 is formed within the donor wafer 101, wherein the cleave plane 140 may reside in layer 106, in the tensilely strained gettering layer 102, in layer 107, or within any combination thereof. FIG. 1E illustrates the case where the cleave plane 140 forms in layer 106, but it should be appreciated that the embodiments described herein are by no means limited to that case. For example, in certain areas of the donor wafer 101, the cleave plane 140 may reside in the gettering layer 102, and in other areas, the cleave plane 140 may reside in layer 106 and/or layer 107. As such, the cleave plane 140 is proximate the tensilely strained gettering layer 102 in numerous embodiments, which is meant to include the case wherein the cleave plane 140 resides within the tensilely strained gettering layer 102. For instance, in certain examples, the cleave plane 140 may reside in the gettering layer 102 and/or within about 20 nm of either side of the gettering layer 102.

In some embodiments, the cleaving action that forms the cleave plane 140 may be induced by annealing the bonded wafer pair. Annealing not only increases the bond strength between the donor wafer 101 and the handle wafer 120, thereby providing support for the transferred layer, but also induces additional selective damage to gettering layer 102 by way of gettering surrounding implanted particles and/or point defects. The temperature of this "gettering anneal" depends on a variety of factors including implantation dose and gettering layer thickness, strain and composition. As an example, the annealing temperatures used to transfer a Ge layer from a $Ge/Si_{0.4}Ge_{0.6}$ donor substrate implanted with about $6\times10^{16}$ cm$^{-2}$ [H$^+$] may vary between about room temperature (20°) and about 600° C. with a typical range of about 250–300° C.

In another embodiment, prior to annealing, the donor wafer may also be pre-annealed, in some instances, at a temperature lower than the annealing temperature. A typical pre-anneal temperature used to transfer a Ge layer from a $Ge/Si_{0.4}Ge_{0.6}$ donor substrate implanted with about $6\times10^{16}$ cm$^{-2}$ [H$^+$] can vary between about 200° C. and about 300° C., with a typical temperature of about 250° C., for pre-annealing times between about 1 and 5 hours, and typically about 3 hours. Following the pre-anneal operation, an annealing step may be performed at a temperature between about 20° C. and about 600° C. with a typical range of about 250–300° C., for a time between about 10 and about 1000 seconds, typically about 100 seconds. In some embodiments, a pre-anneal step may occur before wafer bonding, or in-situ during the particle implantation step itself, wherein an in-situ pre-anneal operation can occur either by self heating of the wafer or direct heating during the implantation step.

Figure 1F:
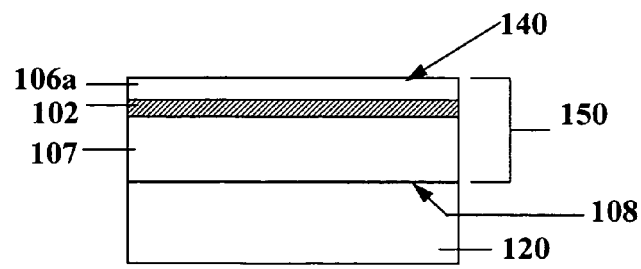
FIG. 1F is a schematic illustration of transferred layers on the handle wafer, after cleaving the bonded pair in FIG. 1E.

FIG. 1F illustrate the transferred layers 150 disposed over the handle wafer 120 after the completion of the cleaving action. In this illustration, a portion of layer 106, denoted by 106a, the tensilely strained gettering layer 102, and layer 107 are transferred onto the handle wafer 120 since the cleave plane 140 resided in layer 106. As noted, the cleave plane 140 may reside in layer 106, in the tensilely strained gettering layer 102, in layer 107, or within any combination thereof. As such, transferred layers 150 would vary in each case, and may not include layer 106a in situations where the cleave plane 140 resides in the tensilely strained gettering, or may not include both layer 106a and 102, in cases where the cleave plane 140 resides in layer 107.

Figure 2:
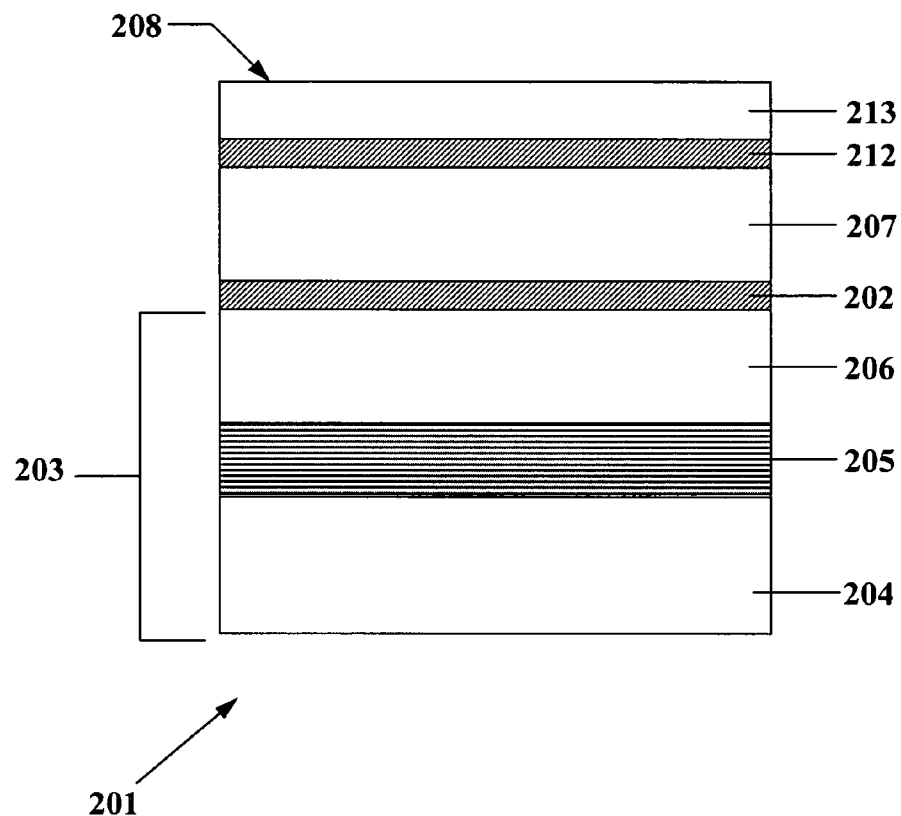
FIG. 2 is a schematic illustration of a donor wafer comprising additional layers disposed over a tensilely strained gettering layer.

In some embodiments, additional layers may be exfoliated from the donor wafer by disposing additional layers over the tensilely strained gettering layer prior to layer exfoliation. As illustrated for the donor wafer 201 in FIG. 2 (wherein identifiers 202–208 in FIG. 2 represent similar layers as identifiers 102–108 in FIG. 1), additional layers 212 and 213 may be disposed over the tensilely strained gettering layer 202 and may comprise any material that may be relaxed, tensilely strained, or compressively strained. In one embodiment, layer 212 may comprise a strained etch-stop layer and layer 213 may comprise a relaxed semiconductor layer, wherein layer 212 may serve as an etch-stop layer for selective removal of exfoliation damage after layer transfer.

Figure 3:
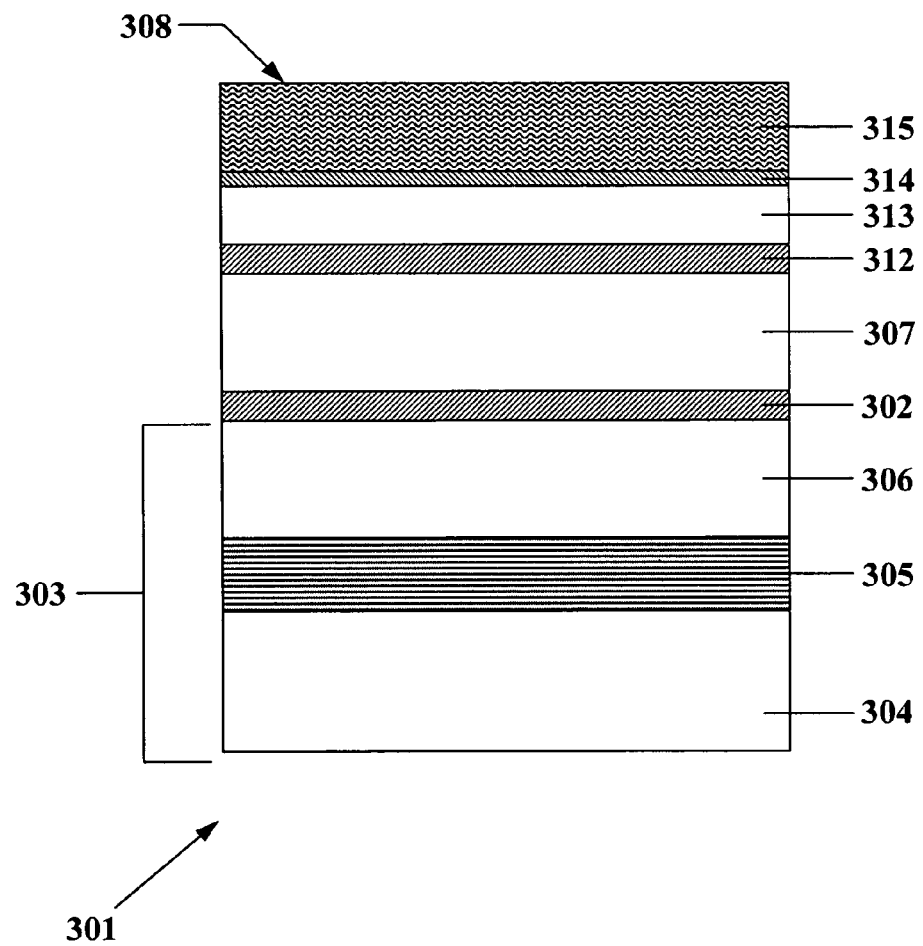
FIG. 3 is a schematic illustration of a donor wafer comprising passivation and polishing layer.

In one embodiment, donor wafers requiring surface passivation and/or planarization prior to wafer bonding may also be prepared with passivation and/or CMP layers. Therefore, in another embodiment illustrated in FIG. 3 (wherein identifiers 302–308 and 312–313 in FIG. 3 represent similar layers as identifiers 202–208 and 212–213 in FIG. 2), a passivation layer 314 may be disposed over layer 313, followed by a CMP layer 315 disposed over the passivation layer 314. The CMP layer allows removal of the surface roughness from the donor wafer 301 prior to wafer bonding. In various different embodiments, other layers may be disposed over layer 307.

In a specific embodiment, a tensilely strained gettering layer may comprise a $Si_{1-x}Ge_x$ ($x \geq 0$) layer disposed over a relaxed $Si_{1-y}Ge_y$ (y>x) substrate. This particular embodiment is relevant to the transfer of strained Si layers via layer exfoliation, enabling the formation of strained Si device layers on the handle wafer. For example, the embodiment allows for the fabrication of a strained Si layer on insulator, wherein devices, including metal-oxide-semiconductor field effect transistors may be fabricated on the strained silicon device layer.

Figure 4:
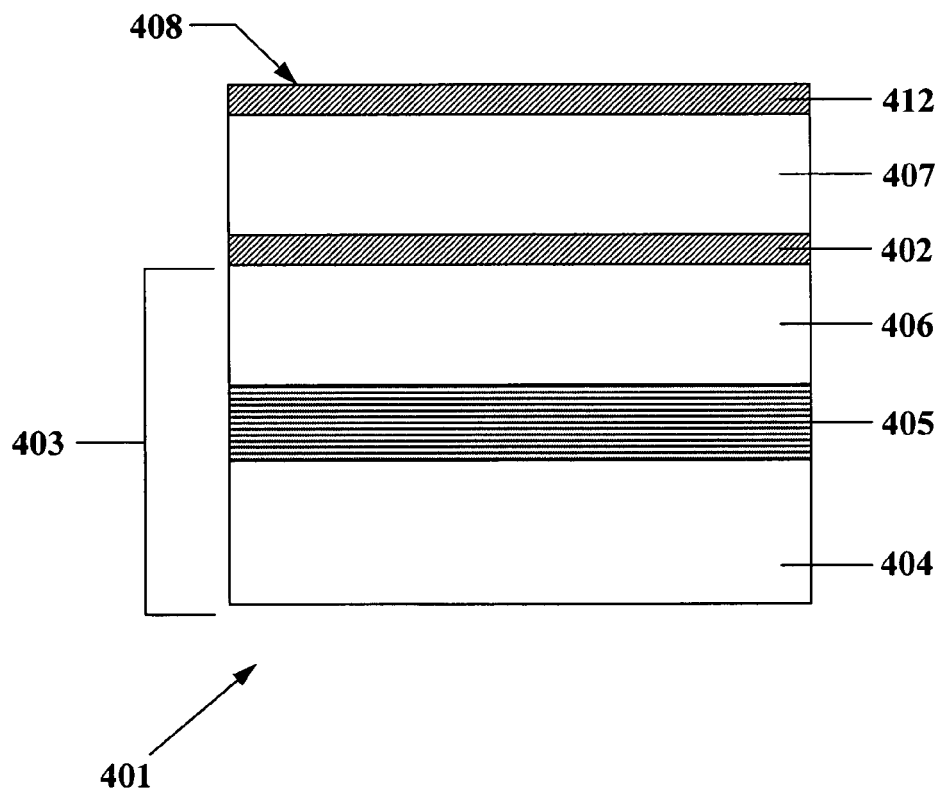
FIG. 4 is a schematic illustration of a donor wafer comprising a strained Si device layer, and a tensilely strained $Si_{1-x}Ge_x$ gettering layer disposed over a relaxed $Si_{1-y}Ge_y$ layer.

FIG. 4 illustrates one embodiment of such a donor wafer 401 that may be used in the fabrication of strained Si transferred to a handle wafer. The donor wafer 401 includes a substrate 403 comprising a Si wafer 404 over which is disposed a $Si_{1-y}Ge_y$ compositionally graded buffer 405 and a relaxed $Si_{1-y}Ge_y$ layer 406 disposed over the graded buffer 405. The composition of the graded buffer depends on the magnitude of strain desired within a strained silicon device layer 412. This value generally varies between about 10% and about 60% Ge, corresponding to y=0.1–0.6 with a typical value of about y=0.25. After an optional planarization of the relaxed $Si_{1-y}Ge_y$ layer 406, a tensilely strained $Si_{1-x}Ge_x$ gettering layer 402 may be grown over the relaxed $Si_{1-y}Ge_y$ layer 406. The Ge content (x) of the gettering layer is smaller than the Ge content (y) of the underlying relaxed layer 406 so as to induce tensile strain within the gettering layer. For a compositionally graded buffer of 25% Ge, the gettering layer can be of any composition ranging between x=0 and about x<0.25, with a typical value of x=0. A relaxed $Si_{1-y}Ge_y$ spacer layer 407 is then disposed over the tensilely strained gettering layer 402, followed by a tensilely strained silicon device layer 412 disposed over the relaxed $Si_{1-y}Ge_y$ spacer layer 407. In this embodiment, the surface 408 of the donor wafer 401 may comprise the surface of the tensilely strained silicon device layer 412, but variations of this embodiment are possible, for example passivation layers, CMP layers, or additional device layers may be disposed over the tensilely strained silicon device layer 412.

Figure 5A:
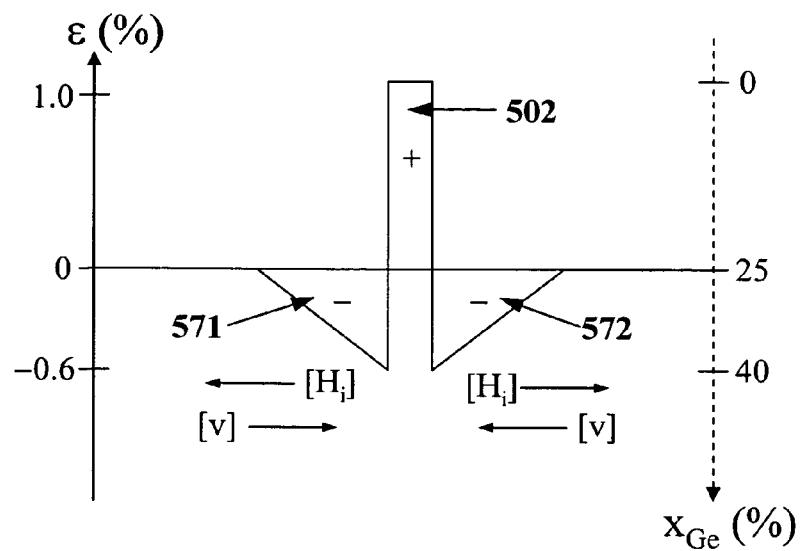
FIG. 5A is schematic illustration of strain gradients for drawing vacancies into a tensilely strained gettering layer.
Figure 5B:
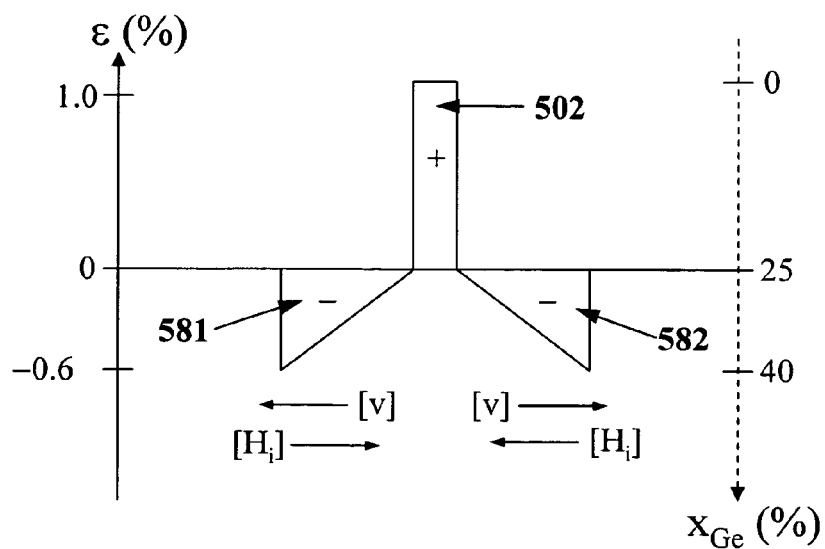
FIG. 5B is schematic illustration of strain gradients for drawing interstitial impurities, for example, hydrogen, into a tensilely strained gettering layer.

In other embodiments, numerous variations of the gettering layer may be incorporated to improve the trapping efficiency of the gettering layer. FIGS. 5A and 5B illustrate two such embodiments, wherein the structure further comprises epitaxially induced strain gradients 571, 572, 581 and 582 proximate a tensilely strained gettering layer 502. These strain gradients are achievable through compositional grading. The orientation of the strain gradient is chosen based on the desired species intended to be propelled into the gettering layer. FIG. 5A illustrates strain gradients 571 and 572, intended to direct vacancies toward the tensilely strained gettering layer 502, while the inverted strain gradients 581 and 582 in FIG. 5B are intended to draw interstitial impurities, such as H and He, towards the tensilely strained gettering layer 502. In some embodiments, the strain gradients 571, 572, 581 and 582 posses a linear profile, but, in general, may possess any arbitrary profile that tends to draw the desired species into the tensilely strained gettering layer 502.

It should be appreciated that the compositions $X_{Ge}$(%) and strain values $\epsilon$(%) indicated in vertical axes of FIGS. 5A and 5B are only for the purpose of example and are not intended to limit the application of these embodiments. However, in all embodiments, the gettering layer is tensile. Incorporation of these strain gradients increases the spatial range of influence of the gettering layer on the gettering species, thereby increasing its gettering efficiency.

Figure 6:
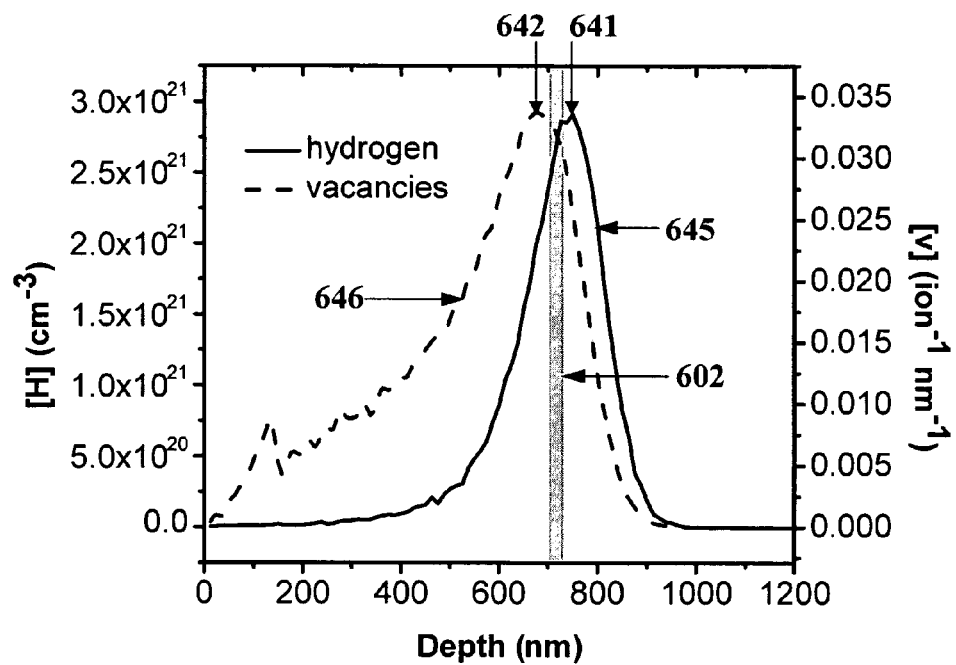
FIG. 6 is a graph of an implantation ion profile and vacancy ion profile in relation to the location of a gettering layer.

In numerous embodiments of layer exfoliation incorporating tensilely strained gettering layers, the total thickness of layers disposed over the tensilely strained gettering layer is partly based on the desired thickness of the exfoliated layer. More generally, the distance from the surface of the donor wafer to the gettering layer determines the required implantation depth. As illustrated in FIG. 6, the implantation depth may be chosen so that the ion (e.g., hydrogen) concentration profile 645 and ion damage (e.g., point defects) profile 646 fall within a determined proximity relative to a tensilely strained gettering layer 602. This is significant since the tensilely strained gettering layer 602 getters the implanted species and the point defects induced by the implantation step, both of which are important for layer exfoliation. Therefore, the nominal implantation profile is one where both the implanted species and associated point defects (e.g., vacancies) are in close proximity to the gettering layer. During light ion implantation, the spatial extent of the ions is larger than that of the resulting vacancies. In practice, the peak 641 of the implanted ion profile 645 should be within about 250 nm of the gettering layer 602. However, as illustrated in FIG. 6, the preferred embodiment is such that the gettering layer 602 is located in the region between the peak 641 of the ion profile 645 and peak 642 of the vacancy profile 646.

The implantation depth is determined by a variety of factors including ion energy, the atomic mass of the implanted species and target composition. The implantation energy is partly limited by the implantation tool, which generally provides ion energies ranging from about 1 keV to 1 MeV. The implanted species is preferably chosen to be any combination of light ions in order to provide a limited and confined damage profile; these include but are not limited to electrons, $H^+$, $H_2^+$, $D^+$ and $He^+$ particles. The implantation dose can vary between about $10^{15}$ and about $10^{18}$ cm$^{-2}$ with typical dose of about $10^{16}$ cm$^{-2}$. In other embodiments, the donor wafer can be implanted partly or in whole with higher atomic mass ion particles in order to create a damaged region proximate the gettering layer that is suitable for layer exfoliation. The higher atomic mass particles include but are not limited to noble gas ions ($Ar^+$, $Ne^+$, $Kr^+$, $Xe^+$), self ions ($Si^+$, $Ge^+$) and others.

As previously discussed, for the embodiments illustrated in FIGS. 2 and 3, additional layers can be incorporated with the donor wafer. For example, in relation to FIG. 2, layer 212 may comprise a second tensilely strained SiGe layer to serve as an etch-stop layer. Although it is intended to serve only as an etch-stop, the tensile strain of layer 212 can nonetheless cause it to getter the ion implantation species. Therefore, in this embodiment layer 207 serves as a spacer layer between layer 212 and tensilely strained gettering layer 202. The thickness of the spacer layer should be sufficient to prevent gettering by the etch-stop layer. Therefore, layer 207 should be thick compared to the width of the particle and damage profiles incurred by the implantation step. Concurrently, layer 213 should be sufficiently thin to allow penetration of the particles to the proximity of the gettering layer 202 while utilizing available ion energy. In practice, the thickness of the spacer layer 207 can vary between about 100 nm and about 10 μm with a typical thickness of about 500 nm.

Figure 7:
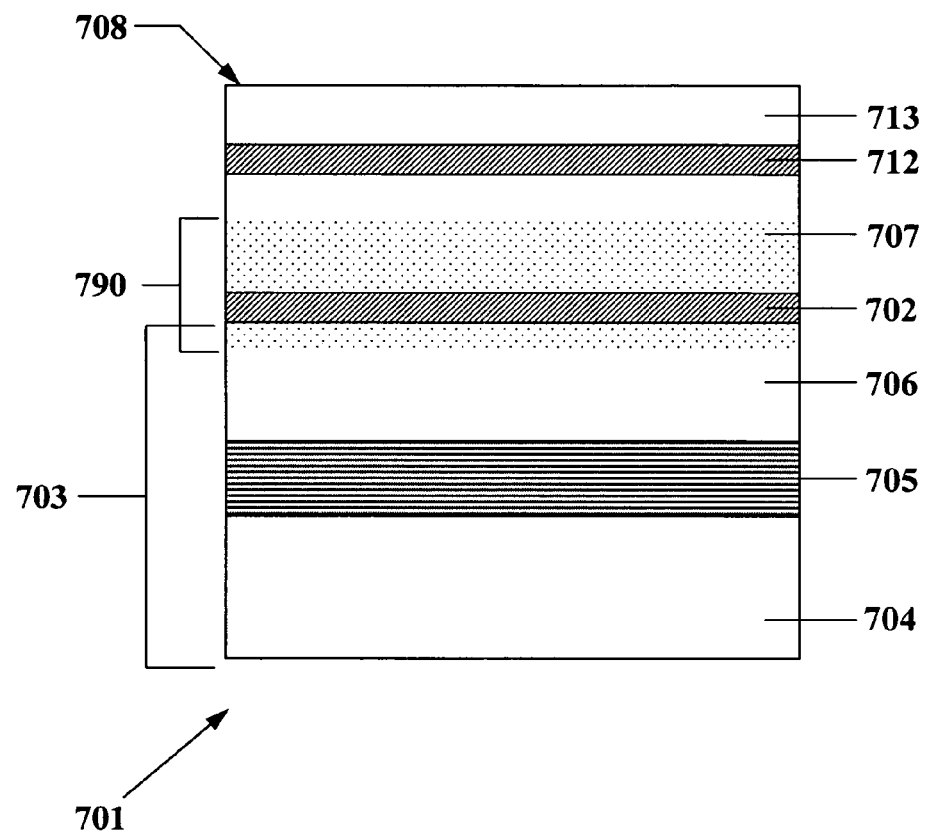
FIG. 7 is a schematic illustration of a donor wafer comprising a particle confining region and a tensilely strained gettering layer.

In some embodiments, additional measures may be taken to prevent gettering by an etch-stop layer 712. As illustrated in FIG. 7 (wherein identifiers 702–708 and 712–713 in FIG. 7 represent similar layers as identifiers 202–208 and 212–213 in FIG. 2), a donor wafer 701 comprises a particle-confining region 790 that encompasses a substantial extent of the implanted ions' spatial profile and may limit gettering by the etch-stop layer 712. In one embodiment, the particle-confining region 790 may reside proximate the tensilely strained gettering layer 702. The confining region 790 may be created by doping the semiconductor with a particle-trapping impurity, such as shallow acceptor impurities including boron, gallium and indium. The trapping impurities can be introduced by a variety of techniques including ion implantation, diffusion or incorporation during epitaxy. In one embodiment, the confining region may be created by selectively introducing damage by means of ion implantation using any number of particles, including light ions, noble gas ions, or self ions.

Figure 8:
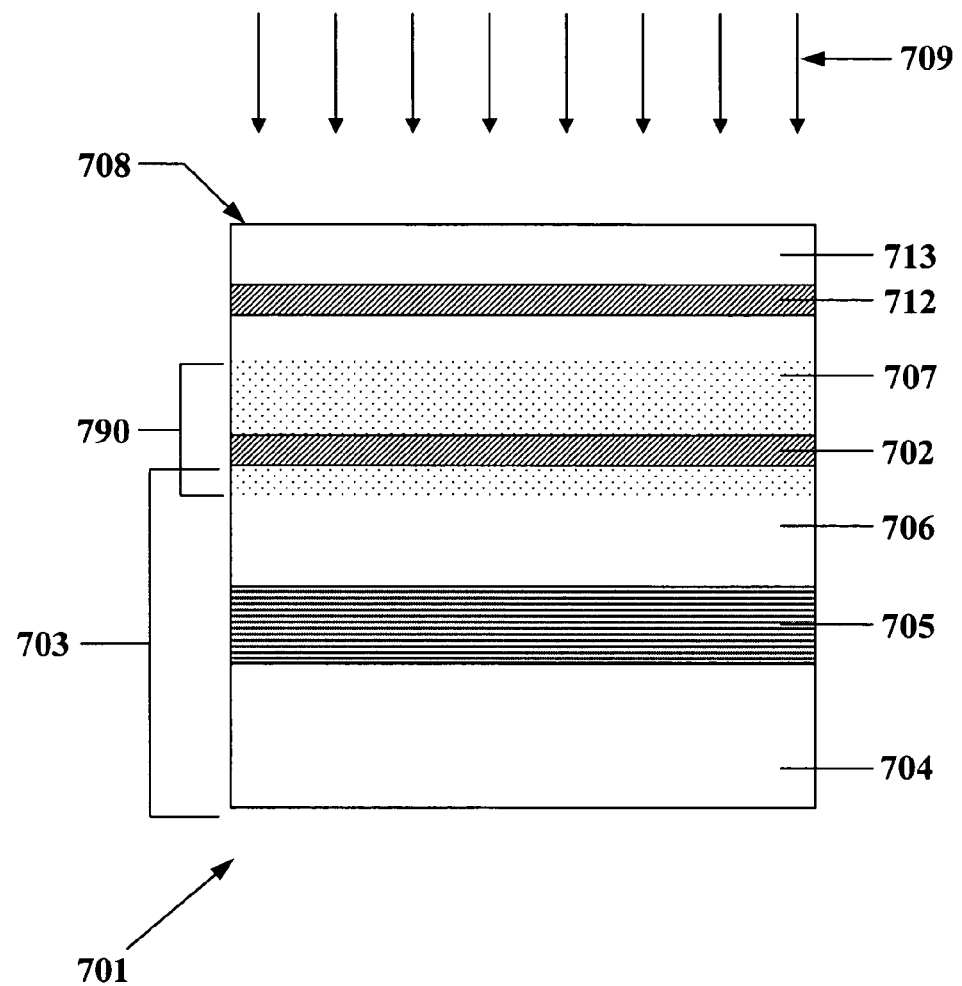
FIG. 8 is a schematic illustration of the implantation of particles into the surface of the donor wafer of FIG. 7.
Figure 9:
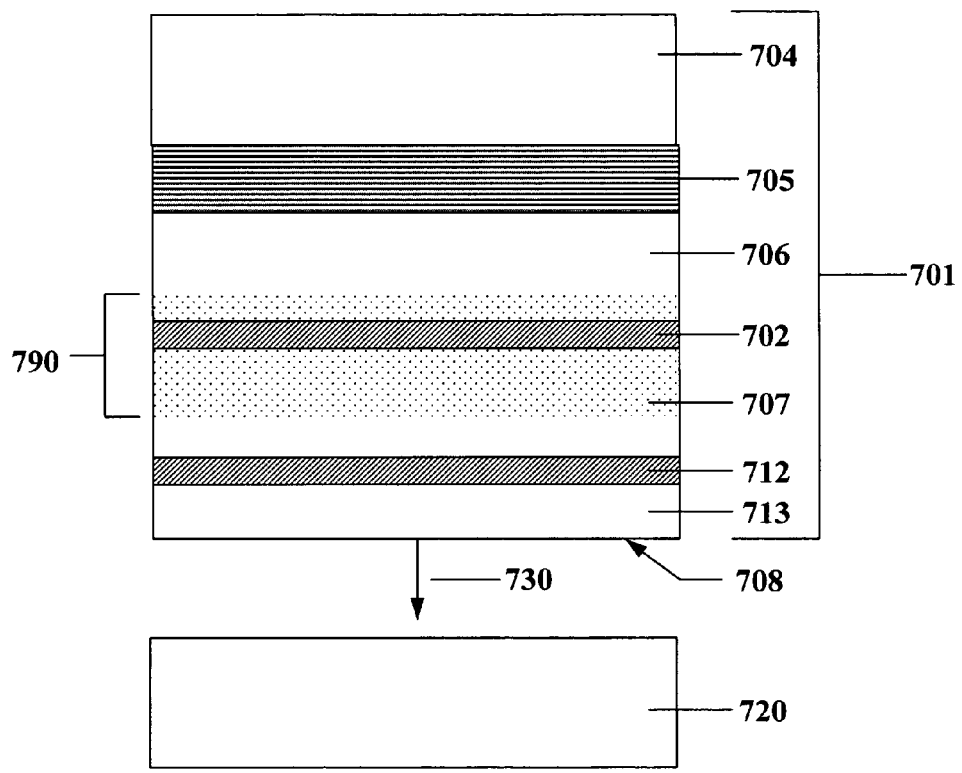
FIG. 9 is a schematic illustration of the bonding of the donor wafer of FIG. 8 with a handle wafer.

Referring to FIG. 8, once a suitable donor wafer 701 is created, it is implanted at 709 with particles to a suitable depth. An optional planarization step (not shown) may be applied before and/or after the implantation step(s) to smooth the surface 708 of the donor wafer prior to bonding. As illustrated in FIG. 9, the donor wafer 701 is then flipped over and bonded (as indicated by arrow 730) to a handle wafer 720. In one embodiment, the corresponding bonded pair 760, illustrated in FIG. 10, may be annealed so as to getter implanted particles and/or point defects to the gettering layer 702, induce the formation of a cleave plane 740, and separate transfer layers 750 from the remaining portion 701a of the donor wafer 701.

Figure 10:
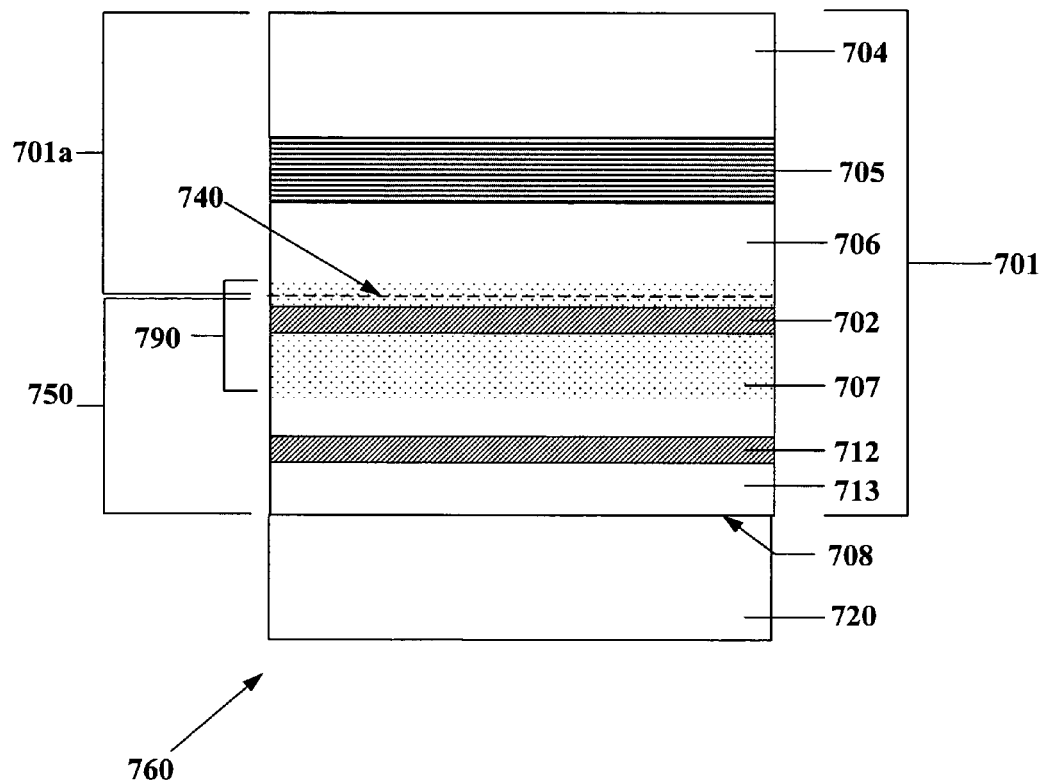
FIG. 10 is a schematic illustration of the wafer bonded pair formed in FIG. 9 with a cleave plane within the donor wafer.

In the example of FIG. 10, the transfer layers 750 include the tensilely strained gettering layer 702 and a portion 706a of layer 706 as a result of the cleave plane residing in layer 706, but in general, the cleave plane 740 may form within the tensilely strained gettering layer 702 or within any other layers in the donor wafer 701. For example, in cases when the cleave plane 740 resides in layer 707, the transfer layers 750 may exclude both layer 706 and the tensilely strained gettering layer 702, or in instances where the cleave plane 740 forms within the tensilely strained gettering layer 702, the transfer layers 750 may include only a portion of the tensilely strained gettering layer 702.

Figure 11:
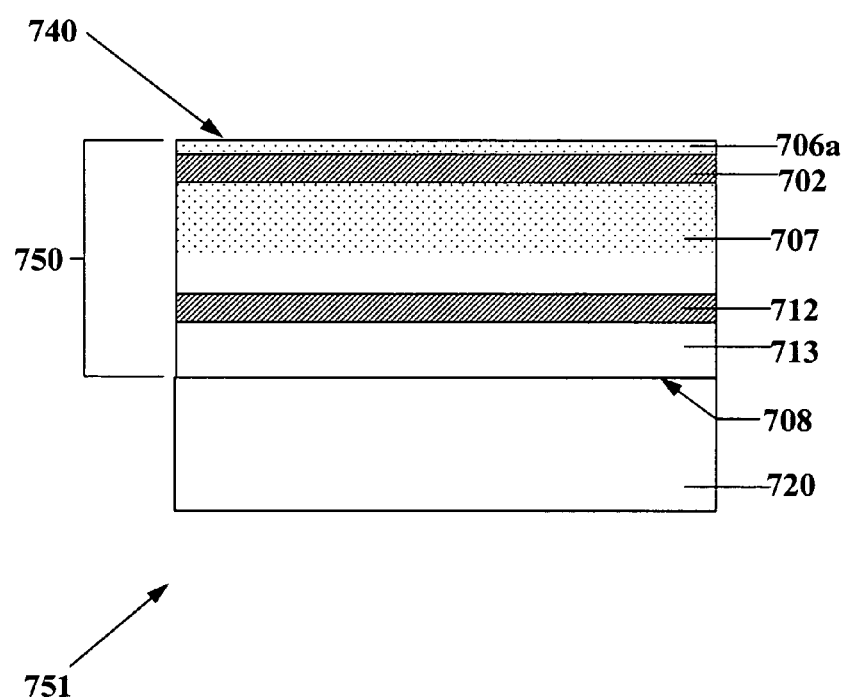
FIG. 11 is a schematic illustration of transferred layers on the handle wafer, after cleaving the bonded pair in FIG. 10.

After the transfer layers 750 are transferred from the donor wafer 701 to the handle wafer 720 forming a structure 751, illustrated in FIG. 11, a variety of processing steps or acts may be performed to prepare the transferred layers for subsequent device fabrication. Depending on the embodiment, further processing steps or acts may include etching, planarization, annealing and other wafer processing steps (the word "step" and "act" being treated synonomously herein).

Figure 12:
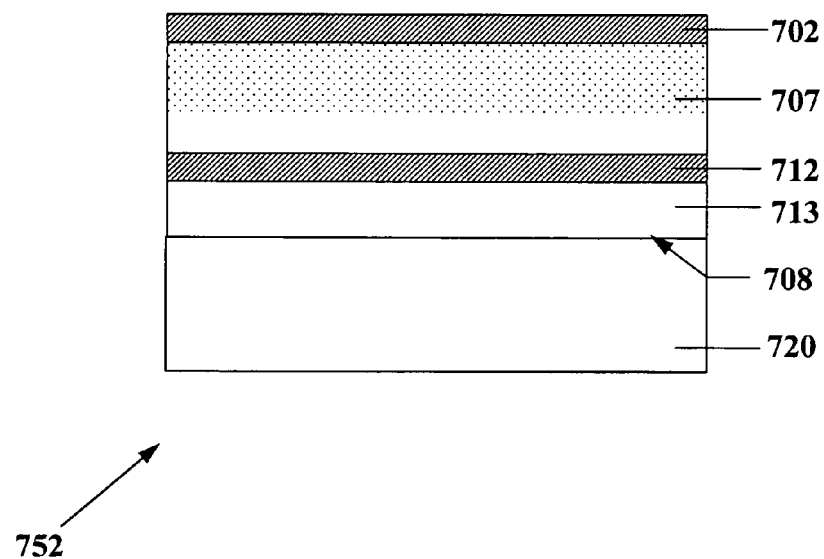
FIG. 12 is a schematic illustration of the removal of the topmost layer of the structure in FIG. 11.

For example, in instances where the cleave plane 740 resides in layer 706, the transferred portion 706a of layer 706 may be removed by planarization and/or selective etching using any etchant that etches layer 706a significantly quicker than the tensilely strained gettering layer 702. Upon removal of layer 706a, as illustrated in FIG. 12, the structure 752 comprises the tensilely strained gettering layer 702 disposed over layer 707, etch-stop 712 and layer 713. Such a structure may be directly produced upon exfoliation in cases where the cleave plane 740 resides within the tensilely strained gettering layer 702.

Figure 13:
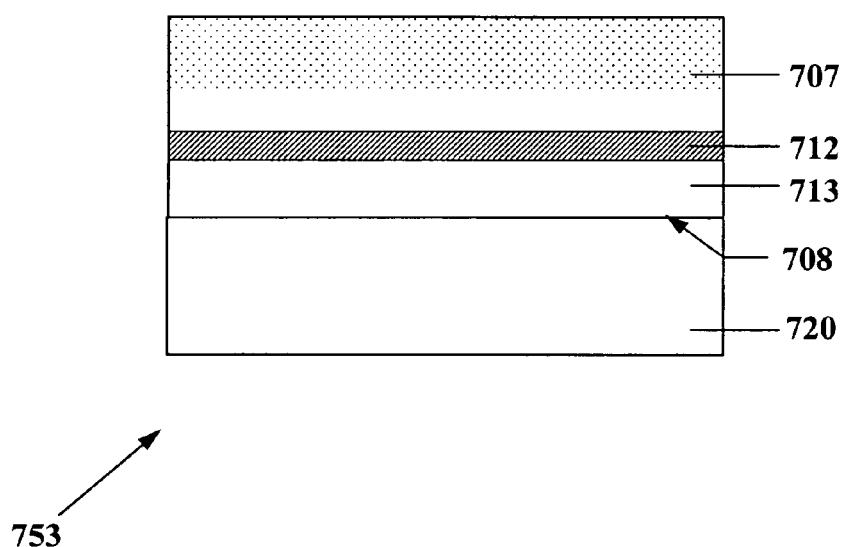
FIG. 13 is a schematic illustration of the removal of the tensilely strained gettering layer of the structure in FIG. 12.
Figure 14:
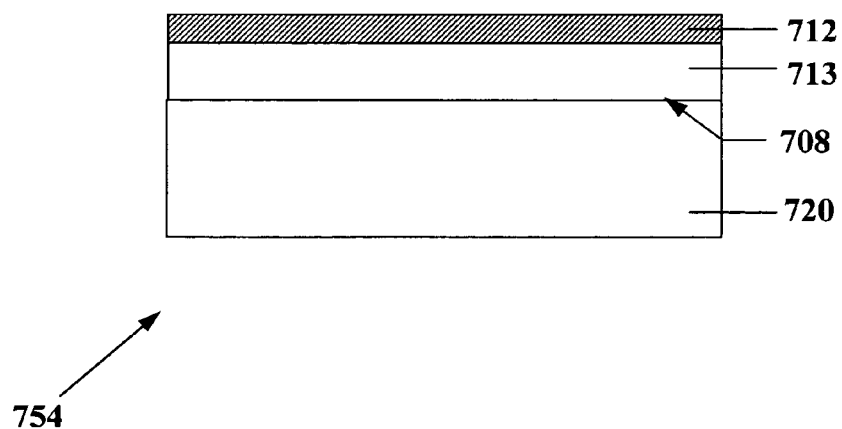
FIG. 14 is a schematic illustration of the removal of the spacer layer of the structure in FIG. 13.
Figure 15:
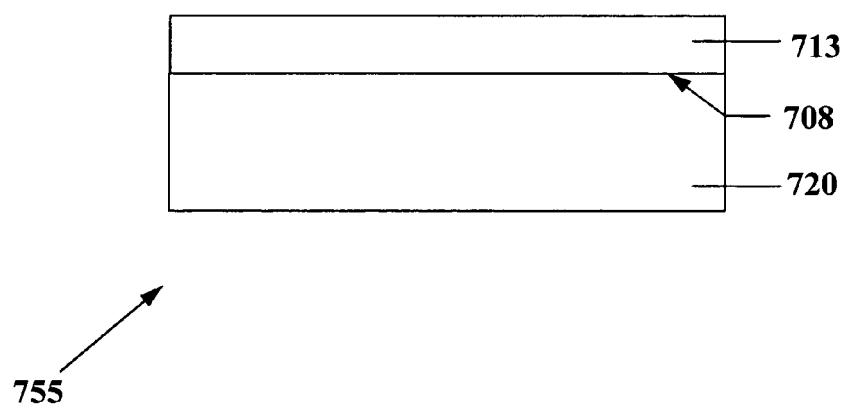
FIG. 15 is a schematic illustration of the removal of the etch-stop layer of the structure in FIG. 14.

In one embodiment, selective etching is then utilized to remove the tensilely strained gettering layer 702, while stopping on layer 707. In some embodiments, CMP may also be used to remove a predetermined amount of material, thereby removing the tensilely strained gettering layer 702, and exposing layer 707, as illustrated in structure 753 of FIG. 13. Next, layer 707 may be removed using a selective etch that stops on the etch-stop 712, as shown in structure 754 of FIG. 14. Structure 754 may be utilized "as is" for any desired device application requiring a surface layer with the properties possessed by the etch-stop layer 712. In some embodiments, the etch-stop layer 712 may be removed using a selective etch and/or a touch polish step, producing a structure 755 comprising a layer 713 disposed over a handle wafer 720, as illustrated in FIG. 15. Structure 755 may then be employed as a starting substrate in the fabrication of any desired device. Examples of structure 755 may include Ge-on-insulator, strained Ge on insulator, strained-Si-on-insulator, Ge-on-Si, GaAs-on-Si, GaAs-on-insulator, to name but a few.

It should be appreciated that the embodiments described herein may be implemented individually, and additionally, any number of embodiments, or aspects of embodiments, may be combined to create further embodiments that are intended to be within the scope of the invention.

Having thus described several aspects of numerous embodiments, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only and the invention is limited only as required by the appended claims.

What is claimed is:

1. A method for separating at least one material layer from a substrate comprising:
   providing a substrate;
   disposing a tensilely strained monocrystalline layer over the substrate, wherein the tensilely strained monocrystalline layer provides gettering sites for particles;
   disposing at least one material layer over the tensilely strained monocrystalline layer, thereby forming a donor wafer comprising the at least one material layer, the tensilely strained monocrystalline layer and the substrate;
   introducing particles through the surface of the donor wafer, to a depth proximate the tensilely strained monocrystalline layer;
   gettering at least some of the particles within the tensilely strained monocrystalline layer; and
   initiating and completing a cleaving action proximate the tensilely strained monocrystalline layer, so as to separate at least a portion of the at least one material layer from the substrate.

2. The method of claim 1 wherein the tensilely strained monocrystalline layer further provides gettering sites for point defects.

3. The method of claim 1 wherein gettering at least some particles within the tensilely strained monocrystalline layer comprises supplying energy to the donor wafer and increasing the concentration of the particles within the tensilely strained mono crystalline layer.

4. The method of claim 2 wherein gettering at least some point defects within the tensilely strained monocrystalline layer comprises supplying energy to the donor wafer and increasing the concentration of the point defects within the tensilely strained monocrystalline layer.

5. The method of claim 3 wherein the energy is supplied to the donor wafer by annealing the donor wafer to a temperature no greater than about 600 degrees Celsius.

6. The method of claim 5 wherein the donor wafer is pre-annealed at a temperature of about 250 degrees Celsius for no longer than about 3 hours, and subsequently annealed at a temperature no greater than about 600 degrees Celsius for a time no greater than about 1000 seconds.

7. The method of claim 1 wherein the tensilely strained monocrystalline layer comprises a tensilely strained monocrystalline semiconductor layer.

8. The method of claim 1 wherein the at least one material layer comprises an etch stop layer.

9. The method of claim 1 wherein the at least one material layer comprises a device layer.

10. The method of claim 1 wherein the at least one material layer comprises a passivation layer.

11. The method of claim 1 wherein the at least one material layer comprises a chemical mechanical polishing layer.

12. The method of claim 1 further comprising disposing a strain gradient layer proximate the tensilely strained monocrystalline layer.

13. The method of claim 1 further comprising placing the surface of the donor wafer in contact with the surface of a handle wafer prior to initiating the cleaving action.

14. The method of claim 1 further comprising disposing a particle confining region proximate the tensilely strained monocrystalline layer.

15. The method of claim 1 wherein the substrate comprises a surface with a lattice constant greater than the lattice constant of relaxed silicon.

16. The method of claim 1 wherein the substrate comprises a relaxed graded buffer.

17. The method of claim 1 wherein the substrate comprises germanium.

18. The method of claim 1 wherein the tensilely strained monocrystalline layer comprises tensilely strained silicon germanium.

19. The method of claim 1 wherein the tensilely strained monocrystalline layer comprises tensilely strained silicon.

20. The method of claim 1 wherein the particles comprise hydrogen.

21. A method for forming extended defects within a tensilely strained monocrystalline layer comprising:
prov101ng a substrate;
disposing a tensilely strained monocrystalline layer over the substrate, wherein the tensilely strained monocrystalline layer provides gettering sites for particles;
gettering at least some particles within the tensilely strained monocrystalline layer; and
forming extended defects within the tensilely strained monocrystalline layer.

22. The method of 21 wherein the tensilely strained monocrystalline layer further provides gettering sites for point defects.

23. The method of claim 21 wherein gettering at least some particles within the tensilely strained monocrystalline layer comprises supplying energy to the donor wafer and increasing the concentration of the particles within the tensilely strained monocrystalline layer.

24. The method of claim 22 wherein gettering at least some point defects within the tensilely strained monocrystalline layer comprises supplying energy to the donor wafer and increasing the concentration of the point defects within the tensilely strained monocrystalline layer.

25. The method of claim 22 wherein the energy is supplied to the donor wafer by annealing the donor wafer to a temperature no greater than about 600 degrees Celsius.

26. The method of claim 25 wherein the donor wafer is pre-annealed at a temperature of about 250 degrees Celsius for no longer than about 3 hours, and subsequently annealed at a temperature no greater than 600 degrees Celsius for a time no greater than about 1000 seconds.

27. The method of claim 21 wherein the tensilely strained monocrystalline layer comprises a tensilely strained monocrystalline semiconductor layer.

28. The method of claim 21 further comprising disposing a strain gradient layer proximate the tensilely strained monocrystalline layer.

29. The method of claim 21 further comprising disposing a particle confining region proximate the tensilely strained monocrystalline layer.

30. The method of claim 21 wherein the substrate comprises a surface with a lattice constant greater than the lattice constant of silicon.

31. The method of claim 21 wherein the substrate comprises a relaxed graded buffer.

32. The method of claim 21 wherein the substrate comprises germanium.

33. The method of claim 21 wherein the tensilely strained monocrystalline layer comprises tensilely strained silicon germanium.

34. The method of claim 21 wherein the tensilely strained monocrystalline layer comprises tensilely strained silicon.

35. The method of claim 21 wherein the particles comprise hydrogen.

36. The method of claim 21 wherein the extended defects comprise platelets.

37. The method of claim 21 wherein the extended defects comprise voids.

38. A method for separating at least one material layer from a substrate comprising:
providing a substrate;
disposing a tensilely strained monocrystalline layer over the substrate, wherein the tensilely strained monocrystalline layer provides gettering sites for point defects;
disposing at least one material layer over the tensilely strained monocrystalline layer, thereby forming a donor wafer comprising the at least one material layer, the tensilely strained monocrystalline layer and the substrate;
introducing particles through the surface of the donor wafer, to a depth proximate the tensilely strained monocrystalline layer;
gettering at least some of the point defects within the tensilely strained monocrystalline layer; and
initiating and completing a cleaving action proximate the tensilely strained monocrystalline layer, so as to separate at least a portion of the at least one material layer from the substrate.

39. The method of claim 38 wherein the substrate comprises a surface with a lattice constant greater than the lattice constant of relaxed silicon.

40. The method of claim 38 wherein the substrate comprises a relaxed graded buffer.

41. A method for forming extended defects within a tensilely strained monocrystalline layer comprising:
providing a substrate;
disposing a tensilely strained monocrystalline layer over the substrate, wherein the tensilely strained monocrystalline layer provides gettering sites for point defects;
gettering at least some point defects within the tensilely strained monocrystalline layer; and
forming extended defects within the tensilely strained monocrystalline layer.

42. The method of claim 41 wherein the substrate comprises a surface with a lattice constant greater than the lattice constant of relaxed silicon.

43. The method of claim 41 wherein the substrate comprises a relaxed graded buffer.

44. A method for separating at least one material layer from a substrate comprising:
providing a substrate;
disposing a tensilely strained monocrystalline layer over the substrate, wherein the tensilely strained monocrystalline layer provides gettering sites;

disposing at least one material layer over the tensilely strained monocrystalline layer, thereby forming a donor wafer comprising the at least one material layer, the tensilely strained monocrystalline layer and the substrate;

introducing particles through the surface of the donor wafer, to a depth proximate the tensilely strained monocrystalline layer;

gettering within the tensilely strained monocrystalline layer; and initiating and completing a cleaving action proximate the tensilely strained monocrystalline layer, so as to separate at least a portion of the at least one material layer from the substrate.

45. The method of claim 44 wherein the tensilely strained monocrystalline layer provides gettering sites for the particles, and gettering comprises gettering at least some of the particles within the tensilely strained monocrystalline layer.

46. The method of claim 44 wherein the tensilely strained monocrystalline layer provides gettering sites for point defects, and gettering comprises gettering at least some of the point defects within the tensilely strained monocrystalline layer.

47. The method of claim 44 wherein the tensilely strained monocrystalline layer comprises a tensilely strained monocrystalline semiconductor layer.

48. The method of claim 47 further comprising disposing a strain gradient layer proximate the tensilely strained monocrystalline layer.

49. The method of claim 47 further comprising disposing a particle confining region proximate the tensilely strained monocrystalline layer.

50. A method for forming extended defects within a tensilely strained monocrystalline layer comprising:

providing a substrate;

disposing a tensilely strained monocrystalline layer over the substrate, wherein the tensilely strained monocrystalline layer provides gettering sites;

gettering within the tensilely strained monocrystalline layer; and forming extended defects within the tensilely strained monocrystalline layer.

51. The method of claim 50 wherein the tensilely strained monocrystalline layer provides gettering sites for particles, and gettering comprises gettering at least some of the particles within the tensilely strained monocrystalline layer.

52. The method of claim 50 wherein the tensilely strained monocrystalline layer provides gettering sites for point defects, and gettering comprises gettering at least some of the point defects within the tensilely strained monocrystalline layer.

53. The method of claim 50 wherein the tensilely strained monocrystalline layer comprises a tensilely strained monocrystalline semiconductor layer.

54. The method of claim 53 further comprising disposing a strain gradient layer proximate the tensilely strained monocrystalline layer.

55. The method of claim 53 further comprising disposing a particle confining region proximate the tensilely strained monocrystalline layer.

* * * * *

UNITED STATES PATENT AND TRADEMARK OFFICE
CERTIFICATE OF CORRECTION

PATENT NO. : 7,202,124 B2  Page 1 of 1
APPLICATION NO. : 10/956481
DATED : October 1, 2004
INVENTOR(S) : Fitzgerald et al.

It is certified that error appears in the above-identified patent and that said Letters Patent is hereby corrected as shown below:

In column 6, line 35, please relace "abouzst" with -- about -- .

Col. 12, line 49, please replace "mono crystalline" with -- monocrystalline -- .

Signed and Sealed this

Nineteenth Day of June, 2007

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 7,202,124 B2 |
| APPLICATION NO. | : 10/956481 |
| DATED | : April 10, 2007 |
| INVENTOR(S) | : Fitzgerald et al. |

It is certified that error appears in the above-identified patent and that said Letters Patent is hereby corrected as shown below:

In column 6, line 35, please relace "abouzst" with -- about -- .

Col. 12, line 49, please replace "mono crystalline" with -- monocrystalline -- .

This certificate supersedes Certificate of Correction issued June 19, 2007.

Signed and Sealed this

Tenth Day of July, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,202,124 B2 | Page 1 of 1 |
| APPLICATION NO. | : 10/956481 | |
| DATED | : April 10, 2007 | |
| INVENTOR(S) | : Fitzgerald et al. | |

It is certified that error appears in the above-identified patent and that said Letters Patent is hereby corrected as shown below:

In the Specification:

Column 1, line 3
Please insert the following paragraph:

FEDERALLY SPONSORED RESEARCH

-- This invention was made with government support awarded by the Army Research Office under Grant Number DAAG55-98-1-0490 and the U.S. Navy under Grant Number N66001-00-1-8954. The government has certain rights in the invention. --

Signed and Sealed this

Eighteenth Day of December, 2007

JON W. DUDAS
*Director of the United States Patent and Trademark Office*